(12) United States Patent
Sugimoto et al.

(10) Patent No.: US 8,071,913 B2
(45) Date of Patent: Dec. 6, 2011

(54) HEATING DEVICE

(75) Inventors: Hiroya Sugimoto, Chiryu (JP); Masao Nishioka, Tokoname (JP)

(73) Assignee: NGK Insulators, Ltd., Nagoya (JP)

( * ) Notice: Subject to any disclaimer, the term of this patent is extended or adjusted under 35 U.S.C. 154(b) by 1056 days.

(21) Appl. No.: 11/939,601

(22) Filed: Nov. 14, 2007

(65) Prior Publication Data

US 2008/0116187 A1  May 22, 2008

(30) Foreign Application Priority Data

Nov. 16, 2006  (JP) .................................. 2006-310521

(51) Int. Cl.
*H05B 3/00*  (2006.01)

(52) U.S. Cl. ...................................... 219/200; 219/634

(58) Field of Classification Search .................. 219/200, 219/600, 634, 618; 428/210; 338/303
See application file for complete search history.

(56) References Cited

U.S. PATENT DOCUMENTS

| | | | |
|---|---|---|---|
| 5,633,073 A * | 5/1997 | Cheung et al. ................. | 428/209 |
| 5,817,406 A * | 10/1998 | Cheung et al. ................. | 428/210 |
| 5,995,357 A | 11/1999 | Ushikoshi et al. | |
| 6,020,076 A | 2/2000 | Fujii et al. | |
| 6,486,542 B1 * | 11/2002 | Ohashi et al. .................. | 257/684 |
| 6,590,760 B1 * | 7/2003 | Fujii ............................. | 361/234 |
| 6,645,304 B2 | 11/2003 | Yamaguchi | |
| 6,838,646 B2 | 1/2005 | Inazumachi et al. | |
| 7,250,215 B2 | 7/2007 | Yoshikawa et al. | |
| 2002/0112820 A1 | 8/2002 | Yamaguchi | |
| 2003/0080110 A1 | 5/2003 | Hiramatsu et al. | |
| 2004/0207072 A1 * | 10/2004 | Hiramatsu et al. ............ | 257/705 |
| 2006/0213900 A1 | 9/2006 | Matsuda et al. | |

FOREIGN PATENT DOCUMENTS

| | | |
|---|---|---|
| JP | 08-277173 A1 | 10/1996 |
| JP | 10-209255 A1 | 8/1998 |
| JP | 2001-357965 A1 | 12/2001 |
| JP | 2002-134590 A1 | 5/2002 |
| JP | 2003-077781 A1 | 3/2003 |
| JP | 2004-104113 A1 | 4/2004 |
| JP | 2005-041765 A1 | 2/2005 |
| JP | 2006-269826 A1 | 10/2006 |

* cited by examiner

*Primary Examiner* — Tu B Hoang
*Assistant Examiner* — John Wasaff
(74) *Attorney, Agent, or Firm* — Burr & Brown

(57) ABSTRACT

A heating device includes an electrode embedded near the heating surface of the ceramic base substantially in parallel to the heating surface. In the rear surface of the ceramic base, a terminal hole extending toward the electrode is formed. Between the bottom surface of the terminal hole and electrode, a conductive ceramic member is embedded and connected to the electrode. The conductive ceramic member has a thermal expansion coefficient equal to that of the ceramic base. The electrode and terminal are electrically connected through the conductive ceramic member.

7 Claims, 6 Drawing Sheets

HEATING DEVICE

CROSS-REFERENCE TO RELATED APPLICATION

This application is based upon and claims the benefit of priority from Patent Application No. 2006-310521 filed on Nov. 16, 2006, in the Japanese Patent Office, of which the contents are incorporated herein by reference.

BACKGROUND OF THE INVENTION

1. Field of the Invention

The present invention relates to a heating device.

2. Description of Related Art

In semiconductor device manufacturing processes using semiconductor manufacturing apparatuses, heating is performed for the purposes of forming an oxidized film on a wafer and the like. One of heating devices used to heat wafers includes: a disk-shaped ceramic base having a heating surface on which a wafer as a heating object is placed and heated; and a resistance heating element embedded in the ceramic base. This heating device is advantageously suitable for not only a film formation apparatus used in a semiconductor manufacturing process but also a surface processing apparatus which performs dry etching for the surface of a plate-shaped material and the like.

In some cases, the wafer undergoes film formation by plasma CVD, plasma etching, or the like during heating by the heating device. A heating device which is capable of forming a plasma atmosphere around the wafer includes a plate-shaped high frequency electrode embedded near the heating surface in the ceramic base substantially in parallel to the heating surface. In the rear surface of the ceramic base opposite to the heating surface, a hole into which a terminal introducing power to the high frequency electrode is inserted is formed toward the high frequency electrode. In the bottom surface of the hole, the high frequency electrode itself or a metallic conductive member connected to the high frequency electrode is exposed and joined by brazing to the terminal inserted in the hole so as to be electrically continuous to the terminal. This terminal is connected to a power supply for supply of power to the high frequency electrode.

In one of the heating devices each including such a high frequency electrode (Japanese Patent Laid-open Publication No. 8-277173), a mesh high frequency electrode is embedded in the ceramic base of aluminum nitride. The high frequency electrode is exposed to the hole of the ceramic base and joined to a Ni terminal with a brazing material.

In another one of the heating devices each including such a high frequency electrode, koval, whose thermal expansion coefficient is intermediate between Mo and Ni, is interposed between a Mo mesh high frequency electrode and a Ni terminal. Mo, koval, and Ni are joined to one another by a brazing material. In still another type thereof (Japanese Patent, Laid-open Publication No. 2002-134590, Japanese Patent Specification No. 3790000), instead of directly joining the Mo mesh high frequency electrode and the koval material, the Mo mesh high frequency electrode is co-sintered with a Mo bulk material having a diameter of 3 mm and a thickness of 2 mm as a conductive member, and the Mo bulk material is joined to the koval material.

Each of such high frequency electrodes is configured to have a planar shape parallel to the heating surface of the ceramic base in order to equalize distribution of plasma generated on the heating object. A part between the high frequency electrode and the heating surface of the ceramic base serves as a dielectric layer or an insulating layer, for example, made of aluminum nitride, which is a material of the ceramic base, and has a thickness of about 1 mm for equalization of the plasma distribution.

Such a structure of the high frequency electrodes is employed in heaters, electrostatic chucks, and susceptors in common.

A general aluminum nitride ceramic base with a high frequency electrode mesh embedded therein has a thickness of about, 5 to 25 mm. In this thickness of the ceramic base, thickness of an aluminum nitride layer serving as the dielectric layer or insulating layer between the high frequency electrode and heating surface is about 1 mm as described above. The ceramic base has a part where the hole is formed, into which the terminal connected to the high frequency electrode is inserted. The part between the bottom of the hole and heating surface is structurally the thinnest and weakest in the ceramic base. Accordingly, cracks might occur in this part.

For example, in a part of the region between the high frequency electrode and the heating surface which faces the hole into which the terminal is inserted, push force is applied when an external conductive connector is assembled and connected to the terminal, and cracks may occur. Moreover, a part of the heating surface of the ceramic base around the top of the terminal becomes colder than the other part during heating of the object because of heat transfer to the terminal. This might produce thermal stress and cause cracks near the terminal in the heating surface of the ceramic base. In the heating device including a Mo bulk material between the hole into which the terminal is inserted and the high frequency electrode, cracks might occur near the terminal because of the difference in thermal expansion coefficient between the Mo bulk material and the aluminum nitride base. These cracks were highly likely to be induced by corrosion of the heating surface due to long-term use of the heating device.

An object of the present invention is therefore to provide a heating device with high reliability and long life by advantageously preventing cracks from occurring near the terminal in the high frequency electrode.

SUMMARY OF THE INVENTION

To achieve the above object, a heating device according to the present invention includes: a plate-shaped base mainly composed of an insulating ceramic; a planar electrode embedded in the base near a surface of the base; a terminal inserted in a terminal hole drilled in the base from the other surface of the base toward the electrode; and a conductive ceramic member having a thermal expansion coefficient equal to that of the insulating ceramic of the base, which is embedded between a bottom surface of the terminal hole and the electrode and connected to the electrode in the base, and the electrode and the terminal are electrically connected through the conductive ceramic member.

According to the heating device of the present invention, it is possible to prevent cracks from occurring near the terminal hole into which the terminal is inserted and therefore provide high reliability.

BRIEF DESCRIPTION OF THE DRAWINGS

The above and further objects, features and advantages of the invention will more fully appear in the detailed description of embodiments of the invention, when the same is read in conjunction with the drawings, in which.

DETAILED DESCRIPTION OF THE INVENTION

Hereinafter, a description is given of embodiments of a heating device of the present invention using the drawings.

Figure 1:
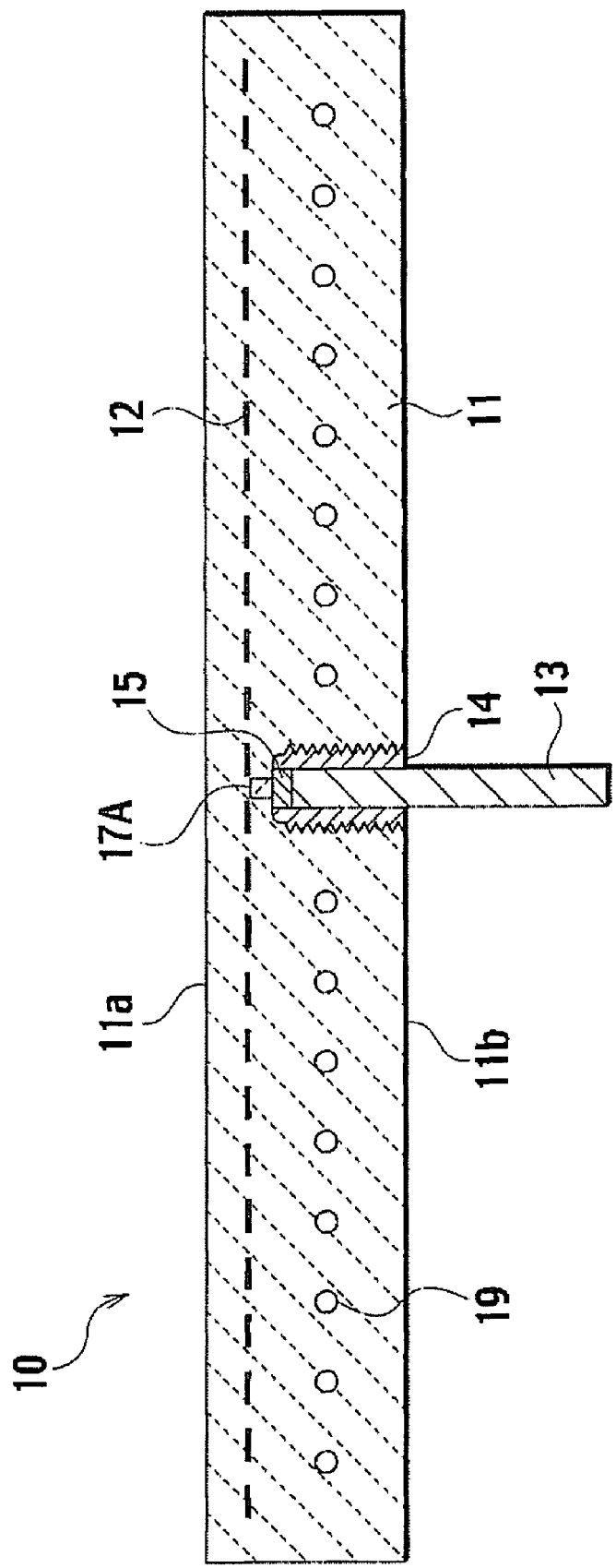
FIG. 1 is a cross-sectional view showing an embodiment of a heating device of the present invention.
Figure 2:
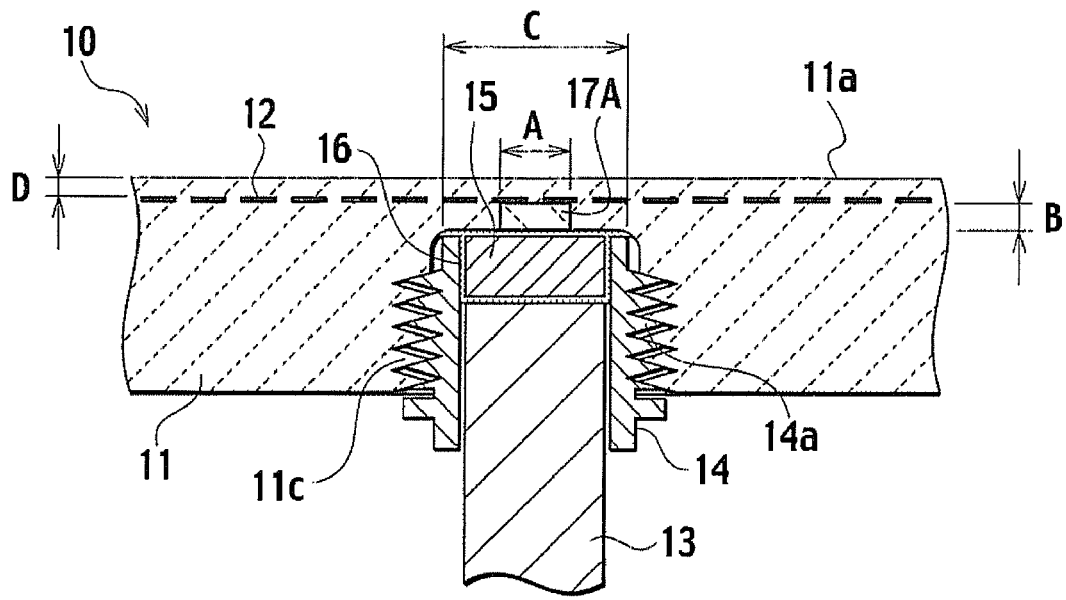
FIG. 2 is a cross-sectional view showing a main portion of the heating device of FIG. 1.

FIG. 1 is a cross-sectional view showing a heating device of an embodiment of the present invention. FIG. 2 is an enlarged cross-sectional view of a main portion the heating device shown in FIG. 1. In the following drawings, measurements and proportions are different from those of a real heating device for easy understanding of the present inventions. Accordingly, the heating device of the present invention is not limited to the dimensions and proportions shown in the drawings.

A heating device 10 shown in FIGS. 1 and 2 includes a disk-shaped ceramic base 11. The ceramic base 11 is made of insulating ceramic mainly composed of aluminum nitride, alumina, or the like. The embodiment shown in FIGS. 1 and 2 is an example in which the ceramic base 11 is made of aluminum nitride. A surface of the ceramic base 11 serves as a heating surface 11a on which for example a semiconductor wafer is placed and heated.

Inside the ceramic base 11, a high frequency electrode 12, which is made of a planar mesh shape metal having a thickness of about 0.2 mm, is embedded substantially parallel to the heating surface 11a at a predetermined distance (for example, about 1 to 1.2 mm) from the heating surface 11a. In a rear surface 11b of the ceramic base 11 opposite to the heating surface 11a, a terminal hole 11c is formed so as to extend toward the high frequency electrode 12. The terminal hole 11c is a screw hole with a thread formed in the inner circumferential surface. In the terminal hole 11c, an end of terminal 13 made of metal (Ni for example) which has resistant to oxidation, is inserted. Another end of the terminal 13 is connected to a high frequency power supply through a not-shown electric connection member.

As shown in FIG. 2, the terminal hole 11c of the heating device 10 is screwed with a metallic sleeve 14 (for example, made of Ni), which is resistant to oxidation, through the thread of the terminal hole 11c and a thread of the sleeve 14. The terminal 13 is inserted into the terminal hole 11c with the sleeve 14 interposed therebetween. The terminal 13 and sleeve 14 are joined by brazing.

In the bottom surface of the terminal hole 11c, a stress relieving member 15 made of for example koval, which has a thermal expansion coefficient intermediate between those of the Ni terminal 13 and aluminum nitride, is provided. The stress relieving member 15 and terminal 13 are joined with a brazing material 16.

In the heating device 10 of this embodiment, a conductive ceramic member 17A is embedded in contact with the high frequency electrode 12 between the bottom surface of the terminal hole 11c and high frequency electrode 12. A part of the surface of the conductive ceramic member 17A is exposed in the bottom surface of the terminal hole 11c. The conductive ceramic member 17A is made of ceramic mainly containing aluminum nitride and additionally containing a conductive material, for example, carbon fiber, carbon nanotubes. The conductive ceramic member 17A and the stress relieving member 15 are joined by the brazing material 16 to electrically connect the conductive ceramic member 17A, the stress relieving member 15 and terminal 13. In this embodiment, a diameter A of the conductive ceramic member 17A is smaller than a diameter C of the terminal hole 11c, and a thickness B of the conductive ceramic member 17A is equal to, or thicker than the thickness of the Mo bulk material of the conventional heating device. A distance D between the heating surface 11a and the high frequency electrode 12 in contact with the conductive ceramic member 17A is equal to that of a known heating device and is about 1 to 1.2 mm, for example.

In order to heat the object placed on the heating surface 11a of the ceramic base 11, a resistance heating element 19 is embedded in the ceramic base 11. Means of heating the object is not limited to the resistance heating element 19 and may be, for example, a heating sheet tightly attached to the rear surface 11b of the ceramic base 11.

In the heating device 10 of this embodiment shown in FIGS. 1 and 2, as described above, the ceramic member 17A, which is made of the same type of ceramic as the material of the ceramic base 11, is embedded between the bottom surface of the terminal hole 11c and the high frequency electrode 12. In other words, the part between the bottom surface of the terminal hole 11c and the high frequency electrode 12 is made of the same type of ceramic material as the ceramic base 11. The thickness of the ceramic material between the heating surface 11a of the ceramic base 11 and the bottom surface of the terminal hole 11c is larger than that of the conventional heating device, for example, such as the heating device with a Mo bulk material embedded between the bottom surface of the terminal hole and the high frequency electrode, or a heating device with the high frequency electrode embedded which is exposed in the bottom surface of the terminal hole. In the conventional heating device, the thickness of such a ceramic material is substantially the thickness of the ceramic material from the heating surface to the high frequency electrode, which is about 1 mm, and this part of the ceramic material is structurally the thinnest and weakest as previously described.

In the heating device 10 according to this embodiment, the ceramic material between the heating surface 11a of the ceramic base 11 and the bottom surface of the terminal hole 11c is thicker than those of the conventional heating devices. This part is therefore increased in strength. Accordingly, it is prevented that cracks are caused by push force to insert the terminal 13 into the terminal hole 11c in a part of the ceramic base 11. Since the ceramic material between the heating surface 11a of the ceramic base 11 and the bottom surface of the terminal hole 11c is made thick, heat transfer to the terminal is suppressed during heating of the object. Moreover, heat capacity of this part is increased, and the temperature distribution of the heating surface 11a is made uniform, thus reducing thermal stress. It prevents cracks from occurring in the ceramic base 11 near the terminal.

Moreover, the highly thermally conductive Mo bulk material, which is made of metal, is not embedded between the high frequency electrode 12 and the bottom surface of the terminal hole 11c unlike the conventional heating device. Accordingly, it is possible to reduce defects due to the embedded Mo bulk material, for example, such as cracks caused at heating or brazing by the difference in thermal expansion coefficient between the Mo bulk material and the ceramic material therearound, or cracks caused by local temperature differences which are generated because the Mo bulk material has higher thermal conductivity than that of the ceramic therearound and the part of the ceramic base 11 near the top of the terminal is colder than the other part. The heating device is therefore provided with high reliability for a long term.

Furthermore, the distance D between the high frequency electrode 12 and heating surface 11a is equal to that of the conventional heating device and does not need to be particularly increased. Accordingly, the conditions (for example, coupling) for generating plasma by the high frequency electrode 12 can be the same as those of the conventional one. If the distance D is increased in order to suppress occurrence of cracks and increase strength, coupling does not match, making it difficult to generate enough plasma. In the heating device of this embodiment of the present invention, such a problem does not occur.

In the heating device of this embodiment, the conductive ceramic member 17A, whose main component is the same as that of the ceramic base 11, is embedded between the high frequency electrode 12 and the bottom surface of the terminal hole 11c. This conductive ceramic member 17A has a thermal expansion coefficient equal to that of the ceramic base 11, and therefore there is little difference in thermal expansion coefficient between the conductive ceramic member 17A and the ceramic material therearound. Accordingly, cracks due to the difference in thermal expansion coefficient do not occur. Specifically, the difference in thermal expansion coefficient is not more than $0.3 \times 10^{-6}$/K. Since the conductive ceramic member 17A has a thermal conductivity equal to that of the ceramic material therearound. Accordingly, it is prevented that the temperature of the conductive ceramic member 17A is locally reduced, and cracks due to thermal stress are therefore reduced.

The material of the conductive ceramic member 17A is a conductive ceramic material having a lower resistance than that of the ceramic base 11. The ceramic member 17A, for example, can be aluminum nitride containing carbon fibers as disclosed in Japanese Patent Laid-open Publication No. 2005-41765. In addition, the conductive ceramic member 17A can be made of aluminum nitride containing an oxide of a rare earth element such as yttrium oxide, cerium oxide, or samarium oxide, which has been known as a low-resistance aluminum nitride ceramic, or aluminum nitride containing about 35 to 65 wt % of heat-resistant and conductive metal or intermetallic, for example, such as tungsten (W) or tungsten carbide (WC).

The volume resistivity of the conductive ceramic member 17A needs to be lower than that of the ceramic base 11 and allow the stress relieving member 15 connected to the terminal 13 and the high frequency electrode 12 to be electrically connected. In the perspective of obtaining good electrical conductance, the conductive ceramic member 17A can be made of a material having a volume resistivity of not more than 10 Ω·cm, for example. More preferably, the volume resistivity of the conductive ceramic member 17A is not more than 0.05 Ω·cm. With a volume resistivity of not more than 0.05 Ω·cm, Joule heat generated by applying current to the conductive ceramic member 17A can be not more than 0.2% of the total input power, and the conductive ceramic member 17A does not generate abnormal heat. Examples of a material having a volume resistivity in such a numerical range include a low-resistance aluminum nitride ceramic material containing carbon fibers which is disclosed in the foregoing Japanese Patent Laid-open Publication No. 2005-41765 The aforementioned volume resistivity can be obtained by applying the low-resistance aluminum nitride ceramic material containing 7 to 14% carbon fibers (including carbon nanotubes). Especially in the conductive ceramic member 17A with carbon nanotubes dispersed, carbon nanotubes serving as a conducting material in ceramic are continuous in a three-dimensional net, and allow current to efficiently flow therethrough. Moreover, the ceramic member 17A with carbon nanotubes dispersed has a thermal expansion coefficient a little smaller than that of aluminum nitride and therefore completely adheres to the ceramic base 11, which is made of aluminum nitride. Furthermore, the strength of the ceramic member 17A is equal to that of the ceramic base 11 therearound.

When the ceramic base 11 is made of aluminum nitride and the conductive ceramic member 17A is made of the low resistance aluminum nitride ceramic material, the difference in thermal expansion coefficient between the both is small (for example, not more than $0.2 \times 10^{-6}$/K) since the main components thereof are the same. Accordingly, there is little internal stress generated, and the heating device has excellent durability. Moreover, there is little difference in thermal conductivity between the both. Accordingly, the temperature uniformity of the heating surface 11a of the ceramic base 11 is not degraded, thus making it possible to prevent temperature of the portion of the ceramic base 11 around the terminal 13 from dropping. It is therefore more preferable that the material of the conductive ceramic member 17A is the same type of ceramic as that of the ceramic base 11, the main components of which are the same.

As an example of the above same type of ceramic, like this embodiment, using aluminum nitride for the ceramic base 11 and using aluminum nitride containing carbon fibers to have low resistance for the conductive ceramic member 17A are advantageous for manufacture of the heating device. In other words, the ceramic materials of the ceramic base 11 and conductive ceramic member 17A have the same type of matrix. Accordingly, the ceramic base 11 and the conductive ceramic member 17A are completely diffusion-bonded by sintering in the interface therebetween for tight adherence. Moreover, in the ceramic base 11 and the conductive ceramic member 17A, equal sintering shrinkage and thermal shrinkage after sintering occur. Accordingly, there is little internal stress generated, and cracks do not occur, thus making it possible to provide practically enough strength and durability.

Figure 3:
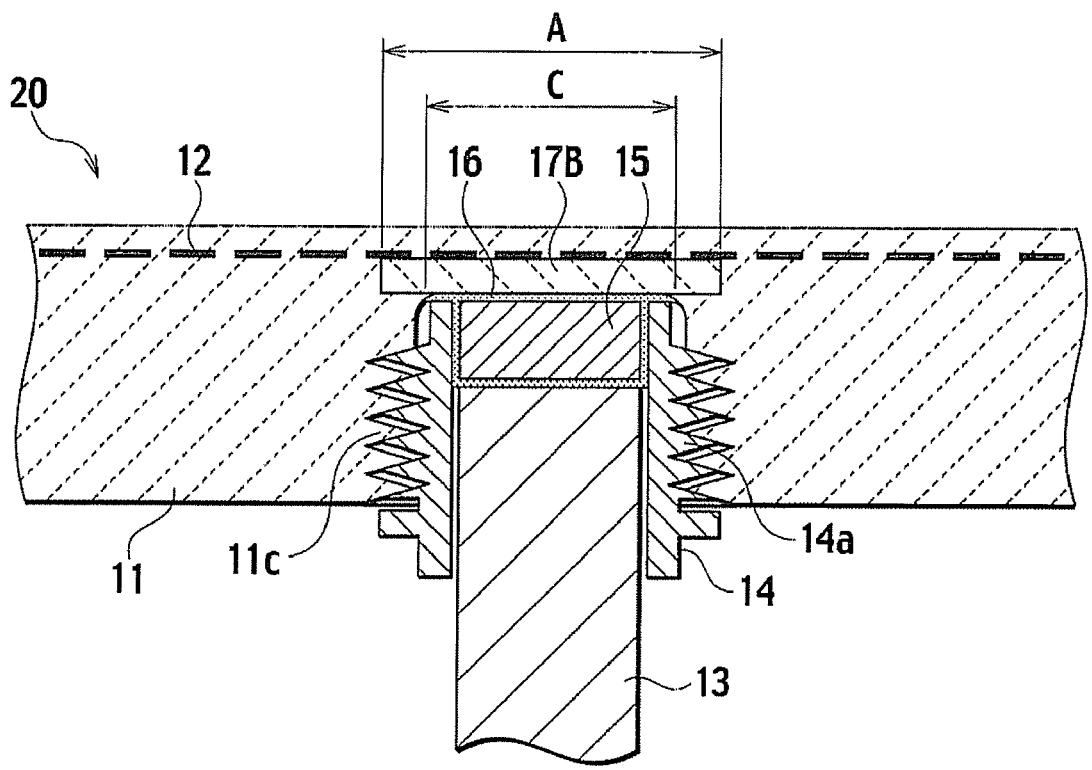
FIG. 3 is a cross-sectional view showing a main portion of another embodiment of the heating device of the present invention.

Next, a description is given of another embodiment of the heating device according to the present invention using FIG. 3. FIG. 3 is a cross-sectional view of a main portion of a heating device 20 according to another embodiment of the present invention. In FIG. 3, same members as those shown in FIGS. 1 and 2 are given same numerals, and the redundant description is omitted below.

In the heating device 20 according to the embodiment shown in FIG. 3, a conductive ceramic member 17B mainly containing aluminum nitride and additionally containing carbon fibers is embedded between the bottom surface of the terminal hole 11c and the high frequency electrode 12. The conductive ceramic member 17B has a plate shape, and its main surface is larger than the bottom surface of the terminal hole 11c. The rest of the conductive ceramic member 17B has the same structure as that of the embodiment shown in FIGS. 1 and 2. The conductive ceramic member 17B can be made of the same material as that of the conductive ceramic member 17A in the embodiment shown in FIGS. 1 and 2.

By including the conductive ceramic member 17B, the heating device according to this embodiment shown in FIG. 3 has similar effects as those of the heating device of the foregoing embodiment described using FIGS. 1 and 2. In addition, in the heating device according to the embodiment shown in FIG. 3, the conductive ceramic member 17B has a planar shape larger than the bottom surface of the terminal hole 11c, so that density of current through the conductive ceramic member 17B can be reduced. It is therefore possible to reduce heat generation of the conductive ceramic member 17B and thus improve the thermal uniformity in the heating surface 11a of the ceramic base 11. Moreover, since the heat generation of the conductive ceramic member 17B can be reduced, the distance between the high frequency electrode 12 and the bottom surface of the terminal hole 11c, that is, thickness of the plate-shaped conductive ceramic member 17B can be further increased without being limited by the heat generation characteristics thereof. Accordingly, the strength of this part can be further increased.

The planar shape of the conductive ceramic member 17B is not particularly limited and preferably is a symmetric shape with respect to the central axis, such as a circle, so that current flowing from the conductive ceramic member 17B to the high frequency electrode 12 can be equally distributed.

Figure 4:
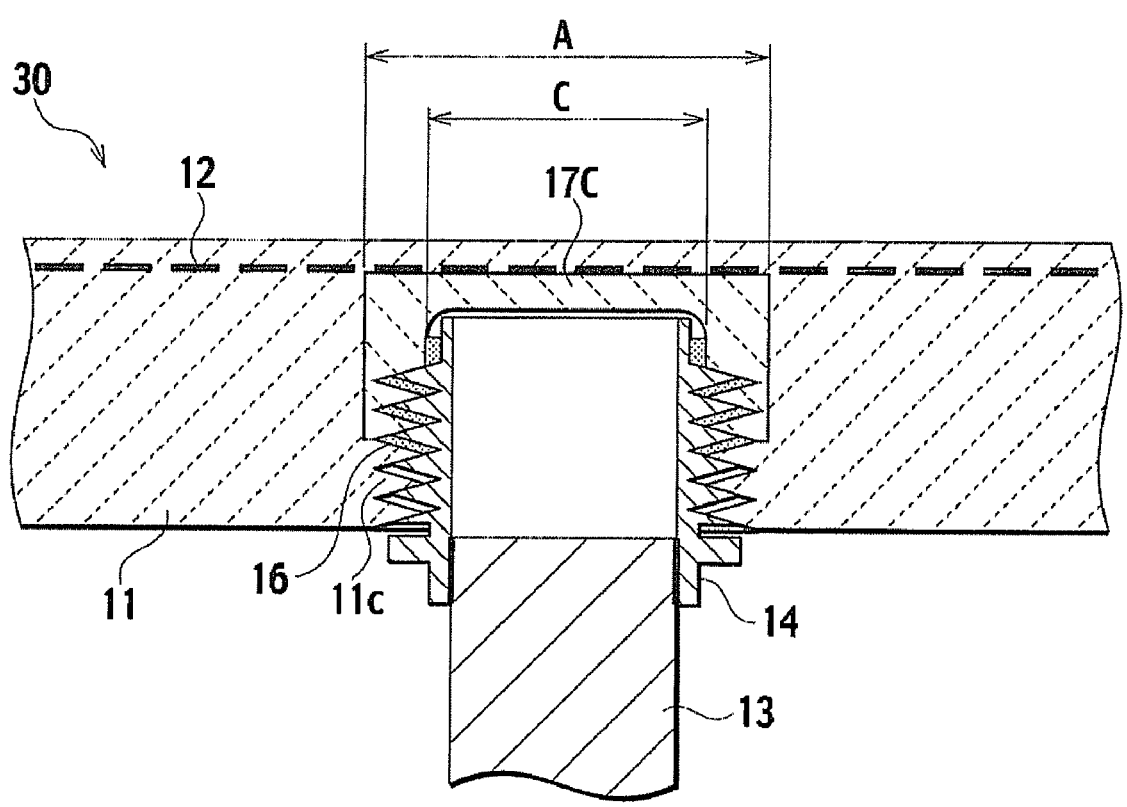
FIG. 4 is a cross-sectional view showing a main portion of still another embodiment of the heating device of the present invention.

Next, a description is given of still another embodiment of the heating device according to the present invention using FIG. 4. FIG. 4 is a cross-sectional view of a main portion of a heating device 30 according to the still another embodiment of the present invention. In FIG. 4, same members as those shown in FIGS. 1 to 3 are given same reference numerals, and redundant description is omitted below.

In the heating device 30 according to the embodiment shown in FIG. 4, a conductive ceramic member 17C is embedded between the bottom surface of the terminal hole 11c and the high frequency electrode 12. The conductive ceramic member 17C is an example having a recess with a downward opening and including a bottom surface and a side surface of the terminal hole 11c. In the inner peripheral surface of the recess, a thread which engages with a thread of a sleeve 14 is formed. The rest of the conductive ceramic member 17C has the same structure as that of the embodiment shown in FIGS. 1 and 2. The conductive ceramic member 17C can be made of the same material as that of the conductive ceramic member 17A in the embodiment shown in FIGS. 1 and 2.

By the conductive ceramic member 17C between the bottom surface of the terminal hole 11c and the high frequency electrode 12, the heating device 30 of the embodiment shown in FIG. 4 has similar effects to those of the heating device 10 of the foregoing embodiment described using FIGS. 1 and 2. In the heating device 30 of the embodiment shown in FIG. 4, the conductive ceramic member 17C constitutes part of the bottom and side surfaces of the terminal hole 11c and has a main plane larger than the bottom surface of the terminal hole 11c. Accordingly, the heating device 30 has similar effects as those of the heating device 20 of the foregoing embodiment described using FIG. 3.

In addition, in the heating device 30 of this embodiment, the conductive ceramic member 17C includes a thread formed in the inner peripheral surface and can be screwed with the sleeve 14 having a thread in the outer peripheral surface. The screwed part can be tightly fixed by further brazing. The conductive ceramic member 17C thus comes into contact with the threaded inner peripheral surface of the sleeve 14, which is fixed to the terminal 13, thus increasing an area of the joint part of the terminal 13. The heating device 30 can be excellent in reliability in the connected portion.

By integrally joining the terminal 13 to the sleeve 14 by brazing, welding, or the like in advance, the terminal 13 and sleeve 14 integrally joined can be screwed with the conductive ceramic member 17C. This eliminates the need to braze these terminal 13 and sleeve 14 to the conductive ceramic member 17C. If brazing is not performed, there is no fear of damaging the members of the heating device 30 by thermal stress due to high temperature of brazing. Furthermore, when the brazing is not performed, the number of steps necessary for joining the terminal 13 can be reduced, thus increasing the productivity. If the terminal 13 and sleeve 14 are not brazed to the conductive ceramic material 17C, the conductive ceramic member 17C may be exposed to a predetermined atmospheric gas, and the surface thereof may be oxidized by oxygen contained in the atmosphere. However, the oxidation of the conductive ceramic member 17C is suppressed and does not become a practical issue when the heating device 30 is used at comparatively low temperature or in a non-oxidation atmosphere.

The heating device 30 of this embodiment shown in FIG. 4 is an example in which the terminal 13 is screwed with the conductive ceramic member 17C with the sleeve 14 interposed therebetween, which is integrally joined to the terminal 13 by brazing or welding. The terminal 13 is bonded to an end portion of the sleeve 14 other than the thread portion and is not in contact with the conductive ceramic member 17C as the bottom surface of the screw hole. The sleeve 14 fits to the conductive ceramic member 17 through the thread portion thereof. The stress relieving member 15 used to relieve stress due to the difference in thermal expansion is not provided between the terminal 13 and the conductive ceramic member 17C. In other words, a part inside the sleeve 14 between the end face of the terminal 13 and the bottom surface of the screw hole of the ceramic member 17C is void. With such a structure, the conductive area is increased by the thread portion, thus making it possible to obtain an adequate conducting function without brazing. Moreover, load applied to the terminal 13 is supported by the entire thread and is not concentrated on the thinnest ceramic part in the bottom of the screw hole. The heating device 30 therefore has high strength to push and pull loads. Moreover, the void prevents heat from directly escaping to the terminal 13. Accordingly, such a structure has an advantage of not generating a cool spot in the heating surface to which this joint structure is attached. Furthermore, in the case of performing brazing, the sleeve 14 has a thin wall and is deformed at brazing to absorb the difference in thermal expansion between the sleeve 14 and the conductive ceramic member 17C, thus achieving strong brazed joint. Moreover, the terminal 13 and conductive ceramic member 17C which are brazed to each other provide better electrical conduction therebetween. The wall thickness of the screwed part of the sleeve 14 is desirably not more than 0.3 mm.

This embodiment is not limited to the example shown in FIG. 4 and may be an example in which the terminal 13 has a shape serving as the sleeve 14. Specifically, the terminal 13 has a shape having a thread screwed with the thread of the conductive ceramic member 17C in the top of the terminal 13. The terminal 13 and conductive ceramic member 17C are directly screwed or brazed to each other.

Figure 5:
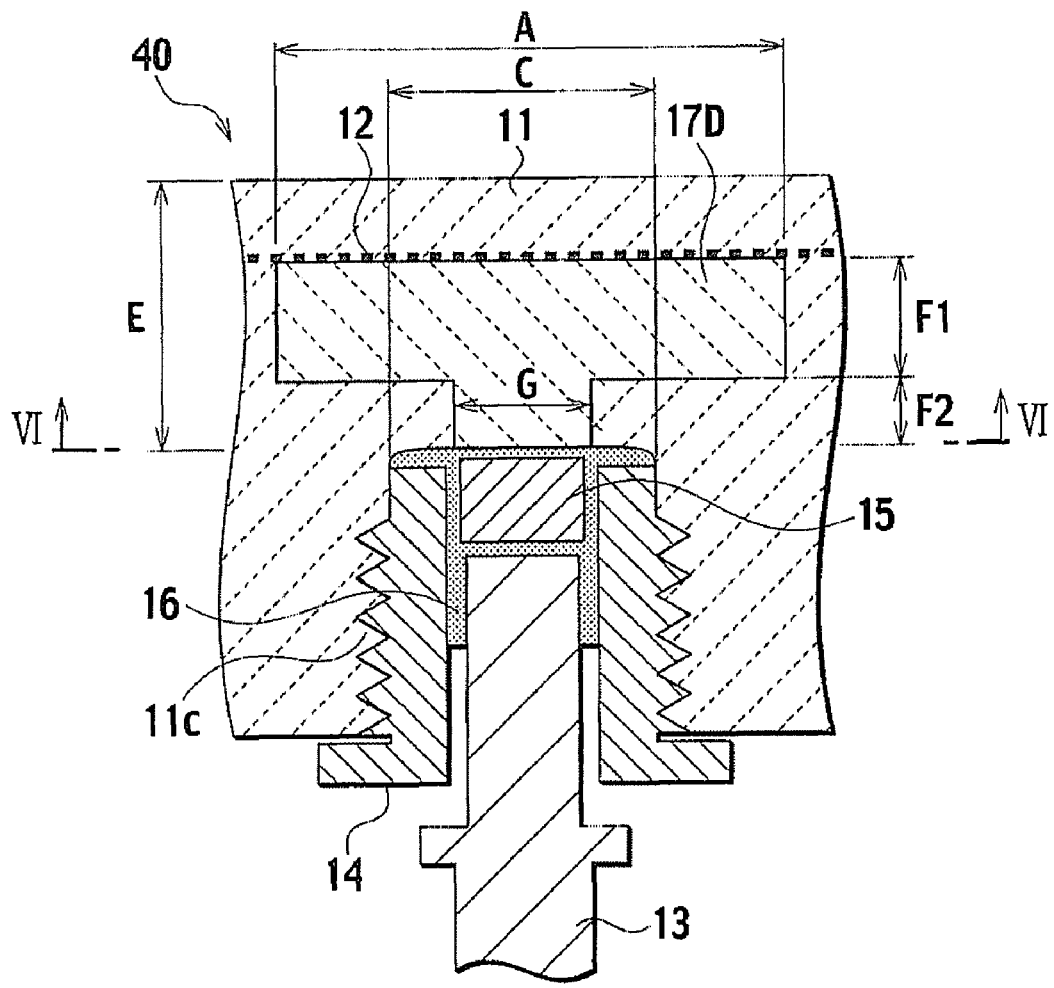
FIG. 5 is a cross-sectional view showing a main portion of still another embodiment of the heating device of the present invention.
Figure 6:
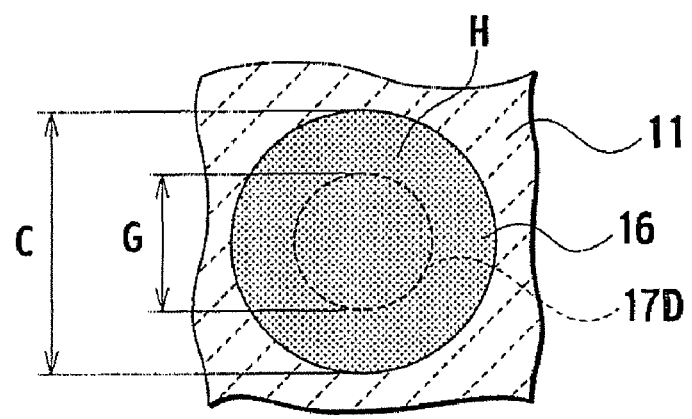
FIG. 6 is a cross sectional view of the heating device of FIG. 5 taken along a line VI-VI.

Next, a description is given of still another embodiment according to the present invention using FIGS. 5 and 6. FIG. 5 is a cross-sectional view of a main portion of a heating device 40 according to the still another embodiment of the present invention. FIG. 6 is a cross-sectional view taken along a line VI-VI of FIG. 5. In FIGS. 5 and 6, same members as those shown in FIGS. 1 to 4 are given same reference numerals, and redundant description is omitted below.

In the heating device 40 according to the embodiment shown in FIGS. 5 and 6, a conductive ceramic member 17D is embedded between the bottom surface of the terminal hole 11c and the high frequency electrode 12. The conductive ceramic member 17D is a protruding shape protruding downward, and a protruding top part thereof is exposed in the bottom surface of the terminal hole 11c. As for the protruding shape of the conductive ceramic member 17D, a diameter A of a bottom part of the protruding shape is larger than a diameter C of the bottom surface of the terminal hole 11c. A diameter G of the top part of the protruding shape exposed in the bottom surface of the terminal hole 11c is smaller than the diameter C of the bottom surface of the terminal hole 11c. The rest of the conductive ceramic member 17D has the same structure as that of the embodiment shown in FIGS. 1 and 2. The conductive ceramic member 17D can be made of the same material as that of the conductive ceramic member 17A of the embodiment shown in FIGS. 1 and 2.

By including the conductive ceramic member 17D between the bottom surface of the terminal hole 11c and the high frequency electrode 12, the heating device 40 of this embodiment shown in FIGS. 5 and 6 has similar effects to those of the heating device 10 of the foregoing embodiment described using FIGS. 1 and 2. Moreover, the conductive ceramic member 17D has a shape in which the bottom surface in contact with the high frequency electrode 12 is larger than the bottom surface of the terminal hole 11c. Accordingly, the heating device 40 of the embodiment has similar effects as those of the heating device 20 of the foregoing embodiment described using FIG. 3.

Furthermore, as shown in the cross-sectional view of FIG. 6 taken along the bottom surface of the terminal hole 11c, in the heating device 40 of this embodiment, the diameter G of the top part of the protruding shape exposed in the bottom surface of the terminal hole 11c is smaller than the diameter C of the bottom surface of the terminal hole 11c. The top surface of the protruding shape is therefore smaller than a brazed region H. In other words, the surface of the conductive ceramic member 17D exposed in the bottom surface of the terminal hole 11c is entirely covered with a brazing material. The material of the conductive ceramic member 17D is for example the above described low-resistance aluminum nitride ceramic material containing 7 to 14 wt % carbon fibers. The surface of such aluminum nitride containing 7 to 14 wt % carbon fibers is easily oxidized at high temperature, and electrical resistance of the conductive ceramic member 17D may be increased by long use. In this regard, in the heating device 40 of this embodiment, the top face of the protruding shape is smaller than the brazed region H as described above, and the surface of the conductive ceramic member 17D exposed in the bottom surface of the terminal hole 11c is entirely covered with the brazing material. The conductive ceramic member 17D is not exposed to air, and the oxidation of the surface of the conductive ceramic member 17D is suppressed, thus making it possible to prevent changes in electrical resistance by long use in air.

As for the protruding shape of the conductive ceramic member 17D, it is preferable that the diameter G of the top part of the protruding shape exposed in the bottom surface of the terminal hole 11c is smaller than the diameter C of the bottom surface of the terminal hole 11c by 0.5 mm or more. Specifically, the diameter G of the top part of the protruding shape can be 3 to 5 mm. Moreover, the diameter A of the bottom part of the protruding shape in contact with the high frequency electrode 12 can be, for example, 10 mm or more. The maximum value of the diameter A of the bottom part is not particularly limited, but enough effects can be obtained when the diameter A is 30 mm. Moreover, thickness F1 of the bottom part can be 2 mm or more, and a thickness F2 of the top part can be 1 mm or more. Moreover, when the distance E from the heating surface 11a of the ceramic base 11 to the bottom surface of the terminal hole 11c is 5 mm, enough reliability can be obtained. The distance E may be larger than 5 mm. However, if the distance E is too large, there is a fear of difficulty of manufacturing. Preferably, the distance E is about 10 mm at a maximum.

The protruding shape of the conductive ceramic member 17D of the example shown in FIGS. 5 and 6 is a combination of a disk shape as the bottom part and a cylindrical shape in the top part but not limited to this shape. In the perspective of equally distributing current passing through the conductive ceramic to the high frequency electrode 12, it is more preferable that the protruding shape is symmetrical with respect to the central axis. Examples of the shape symmetrical with respect to the central axis may be shapes having trapezoidal or semi-elliptic cross sections including the central axis, a shape with a curved side face, and combinations thereof.

Figure 7:
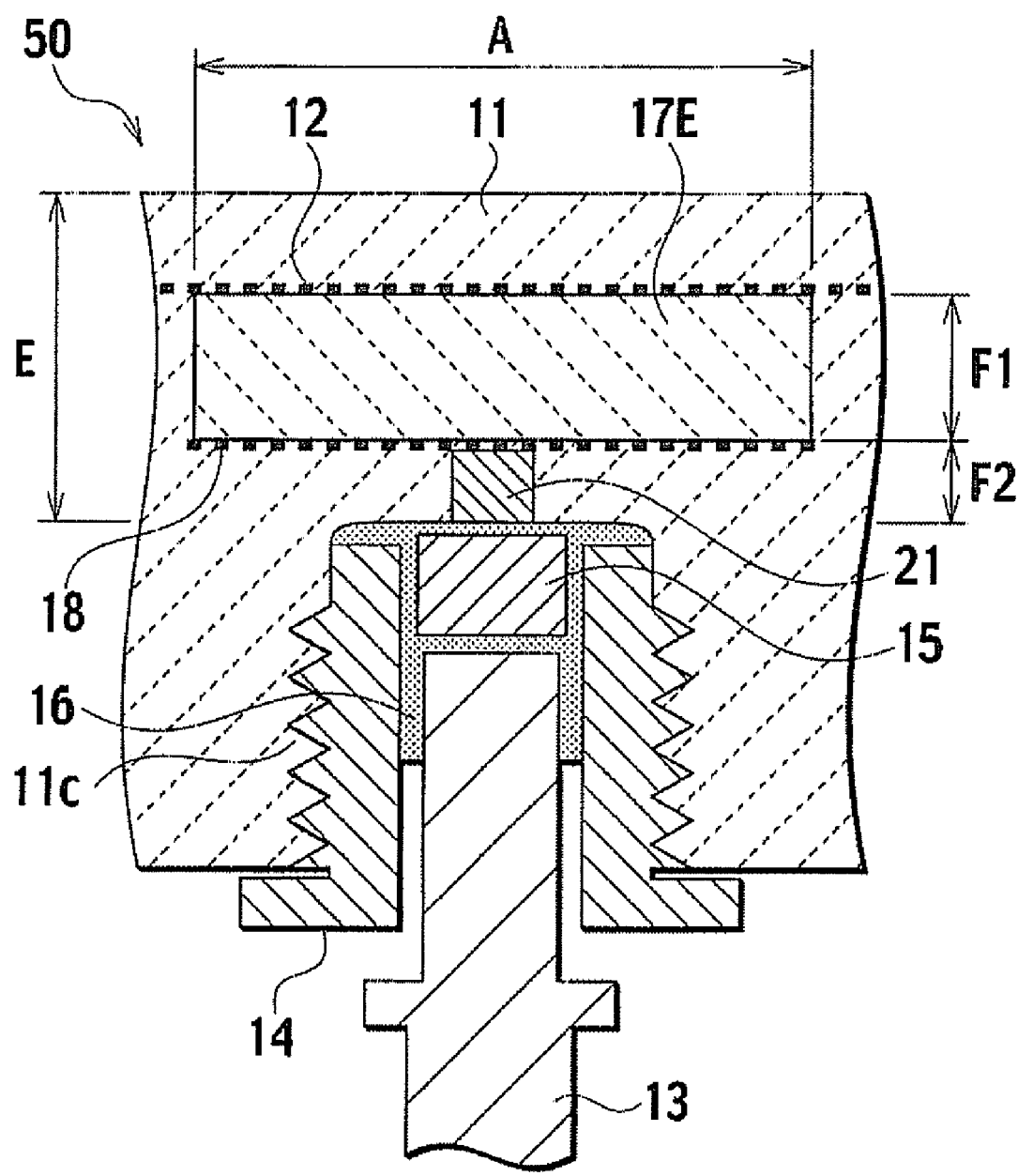
FIG. 7 is a cross-sectional view showing a main portion of still another embodiment of the heating device of the present invention.

Next, a description is given of still another embodiment of the heating device according to the present invention using FIG. 7. FIG. 7 is a cross-sectional view of a main portion of a heating device 50 according to the still another embodiment of the present invention. In FIG. 7, same members as those shown in FIGS. 1 to 6 are given same reference numerals, and redundant description is omitted below.

In the heating device 50 according to the embodiment shown in FIG. 7, a conductive ceramic member 17E is embedded between the bottom surface of the terminal hole 11c and the high frequency electrode 12. The conductive ceramic member 17E has a disk shape. The diameter A of a part in contact with the high frequency electrode 12 is larger than the diameter C of the bottom surface of the terminal hole 11c. A metallic mesh plate 18 is embedded in contact with the conductive ceramic material 17E. In contact with the metallic mesh plate 18, a cylindrical metallic conductive member 21 is embedded between the metallic plate 18 and the bottom surface of the terminal hole 11c. The metallic conductive member 21 has a diameter smaller than the diameter of the terminal hole 11c. An end surface of the metallic conductive member 21 is exposed in the bottom surface of the terminal hole 11c. The metallic conductive member 21 and stress relieving member 15 are brazed to electrically connect the stress relieving member 15 connected to the terminal 13 and the high frequency electrode 12 through the metallic conductive member 21, metallic plate 18, and conductive ceramic member 17E. The rest of this embodiment has the same structure as that of the embodiment shown in FIGS. 5 and 6. Moreover, the conductive ceramic member 17E can be made of the same material as that of the conductive ceramic member 17D of the embodiment shown in FIGS. 5 and 6.

In the heating device 50 of this embodiment shown in FIG. 7, the metallic conductive member 21 and conductive ceramic member 17E constitute a protruding conductive member. Accordingly, the heating device 50 has the same effects as those of the foregoing embodiment described using FIGS. 5 and 6. In addition, in the heating device 50 of this embodiment, the metallic conductive member 21 constituting the top part of the protruding conductive member is made of metal such as Mo. Accordingly, the conductive ceramic member 17E is not exposed in the bottom surface of the terminal hole 11c. It is therefore possible to prevent an increase in electrical resistance due to oxidation of the conductive ceramic member 17E.

Moreover, since the metallic plate 18 is embedded between the metallic conductive member 21 and the conductive ceramic member 17E, the resistance to the push force to insert the terminal 13 into the terminal hole 11c is enhanced.

Figure 8:
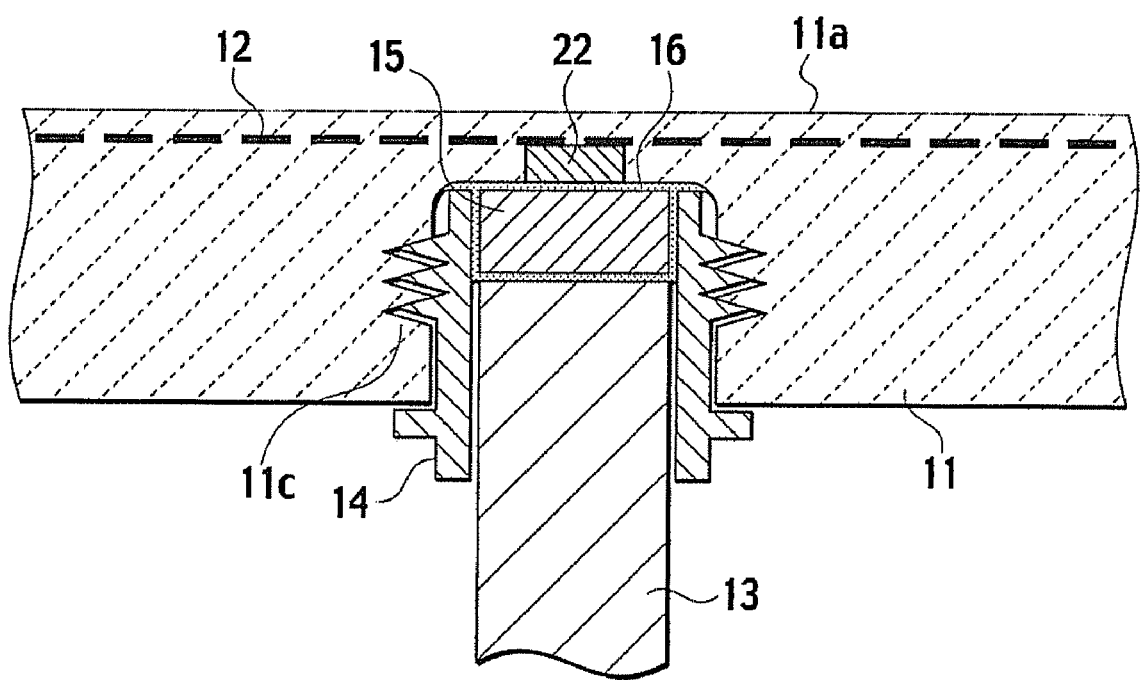
FIG. 8 is a cross sectional view showing a main portion of a conventional heating device.

Next, an example of a conventional heating device is shown in FIG. 8 as a comparative example for the purpose of reference. FIG. 8 is a cross-sectional view of a main portion of a conventional heating device 80. In FIG. 8, same members as those members shown in FIGS. 1 to 7 are given same reference numerals, and redundant description is omitted. In the conventional heating device 80 shown in FIG. 8, a metallic conductive material 22 is embedded in contact with the high frequency electrode 12 embedded in the ceramic base 11. A surface of the metallic conducive material 22 is exposed in the bottom surface of the terminal hole 11c and is brazed to the stress relieving member 15. By such a structure, the high frequency electrode 12 and the terminal 13 are electrically connected through the metallic conductive material 22.

In the conventional heating device 80 shown in FIG. 8, the metallic conductive material 22 is embedded in the ceramic base 11. However, the difference in thermal expansion coefficient between the metallic conductive material 22 and ceramic material therearound caused internal stress, and cracks were sometimes found after the manufacturing process. This is thought to be because the dielectric layer between the heating surface 11a and electrode 12 has a thickness of only 1 to 1.2 mm and is deformed by the internal stress due to the difference in thermal expansion coefficient. Moreover, since the metallic conductive material 22 has good thermal conductance, heat is conducted from the metallic conductive material 22 through the stress relieving member 15 and terminal 13 during heating of the ceramic base 11. Temperature of the ceramic base around the metallic conductive material 22 might be locally reduced, generating thermal stress. Furthermore, the diameter of the metallic conductive material 22 is limited because increasing the diameter of the metallic conductive material 22 causes cracks due to the difference in thermal expansion coefficient. When a large amount of current is flown through the metallic conductive material 22 with such a limited diameter, the current is concentrated to increase the temperature, thus reducing the thermal uniformity in the heating surface 11a. Furthermore, inrush current might cause cracks because of thermal expansion due to an increase in temperature of the metallic conductive material 22.

On the contrary, the aforementioned heating devices 10 to 50 according to the present invention do not have the above described defects of the conventional heating device 80. Accordingly, it is apparent that the heating devices according to the present invention have advantageous effects to the conventional heating device.

Next, a description is given of an example of a method of manufacturing a heating device according to the present invention.

First, raw ceramic powder for the ceramic base 11 and ceramic powder for the conductive ceramic members 17A to 17E are individually prepared.

As for the raw ceramic powder for the ceramic base 11, aluminum nitride raw powder obtained by a conventional known manufacturing method such as reduction nitridation, gas phase synthesis, or direct nitridation, and rare-earth oxide which is added according to the desired volume resistivity such as yttrium oxide or a source compound thereof such as nitrate, sulfate, oxalate, chloride, or alkoxide, are blended at a predetermined ratio; added with a solvent such as isopropyl alcohol; and then mixed by a mixer mill such as a pot mill, a trommel, or an attrition mill. The mixing may be either wet or dry mixing. In the case of wet mixing, the mixture is dried using spray drying to obtain a raw powder mixture. It is desirable to perform vacuum drying for the mixture and sift the dried powder for adjustment of particle size.

As for the ceramic powder for the conductive ceramic members 17A to 17E, aluminum nitride raw powder, carbon fibers, and preferably rare-earth oxide such as yttrium oxide are blended at a predetermined ratio; added with a solvent such as isopropyl alcohol; and then mixed by a mixer mill. The conductive ceramic members can be implemented by adding rare-earth oxide to the aluminum nitride raw powder, for example. More preferably, the sintered body of the electrically conductive ceramic material with carbon fibers is advantageous as it can include many conducting paths formed therein and has a low volume resistivity with the other characteristics of aluminum nitride unchanged.

The carbon fibers have a fiber diameter of not more than 1 µm and an aspect ratio of not less than 5, more preferably, not less than 10. More preferably, the carbon fibers can be carbon nanotubes.

The amount of carbon fibers added to the nitride aluminum raw powder should be determined according to the electrical and physical characteristics necessary for applications of the sintered body eventually obtained. By adding preferably 5 to 20 parts by weight of carbon fibers to 100 parts by weight of the aluminum nitride raw powder, the conductive ceramic member can have a volume resistivity of not more than 10 $\Omega\cdot$cm while maintaining the strength and thermal expansion coefficient equal to those of the ceramic base 11. More preferably, the amount of carbon fibers added is 10 to 15 parts by weight.

In the case of adding a rare-earth oxide, the amount thereof is preferably not less than 0.2 parts by weight and not more than 20 parts by weight, more preferably not more than 10 parts by weight.

The mixing of these raw powders may be either wet or dry mixing. In the case of wet mixing, the mixture is dried using spray drier to obtain the raw powder mixture. Moreover, it is desirable to perform vacuum drying for the mixture and sift the dried powder for adjustment of particle size. The raw powder mixture can be added with a binder such as polyvinyl alcohol. In the case of adding a binder, it is necessary to prevent oxidation loss of carbon fibers by carrying out the process in an inert atmosphere such as nitrogen or the like.

Next, for manufacturing the ceramic base 11, the conductive ceramic members 17A to 17E having desired shapes are formed in advance. Each of the conductive ceramic members 17A to 17E is formed by pressing of the raw ceramic powder into the desired shape. The compact may be fired into a predetermined sintered body. During the manufacturing process of the ceramic base 11, each of the conductive ceramic members 17A to 17E may be either a compact press-formed or a sintered body as long as the conductive ceramic members 17A to 17E surely maintain shapes thereof.

The pressing of the conductive ceramic members 17A to 17E can be performed by a known method for forming of ceramic powder such as mold forming or CIP. More preferably, granulated powder is molded at a pressure as low as possible. This is because a compact formed at high pressure to have high density may deform the high frequency electrode 12 when the compact is used in the after-mentioned forming-process of ceramic base 11. The sintering of the compacts of the conductive ceramic members 17A to 17E can be a known sintering method such as hot pressing, pressureless sintering, or HIP. Desirably, the atmosphere at heating and firing the compacts is a vacuum, inert, or reduction atmosphere so that carbon fibers contained in the conductive ceramic members 17A to 17E are not oxidized and lost. Firing temperature, which depends on the amount of a sintering additive, is preferably 1650 to 2200° C. In the aluminum nitride sintered body obtained after firing, carbon fibers remain dispersed in grains and grain boundaries with the fiber structure of the raw material maintained and are in contact with neighboring carbon fibers to form continuous three-dimensional electrically-conducting paths.

Next, the ceramic base 11 is formed. The ceramic base 11 includes the high frequency electrode 12 and resistance heating element 19 embedded inside. A detailed example of the manufacturing method is as follows; A partial powder compact of the ceramic base 11 divided in the thickness direction is manufactured. The partial compact, high frequency electrode 12, raw ceramic powder, resistance heating element 19, and raw ceramic powder are sequentially stacked and subjected to be pressed. The thus-obtained compact is eventually fired to obtain the sintered body of the ceramic base 11.

The process of producing the ceramic base 11 is described in more detail below. The partial compact of the ceramic base 11 includes a part serving as the heating surface of the ceramic base 11 is formed by uniaxial pressing with a mold.

Next, the high frequency electrode 12 is placed on a surface of the aforementioned partial compact. This high frequency electrode 12 can be a planer electrode with a perforated pattern which is made of a bulk of metal such as Mo or W and more preferably can be a mesh electrode.

Subsequently, the compact or sintered body for each of the conductive ceramic members 17A to 17E is embedded at a predetermined position on the high frequency electrode 12. Such embedding is performed by placing the compact of a predetermined shape for each of the conductive ceramic members 17A to 17E at a predetermined position on the high frequency electrode 12, pouring the raw aluminum nitride powder for the ceramic base therein, and performing uniaxial pressing to the stacked parts together. Alternatively, a hole is formed in the surface of the compact in the thickness direction, and the compact of each of the conductive ceramic members 17A to 17E is mechanically pressed into the hole.

To obtain the structure shown in FIG. 7, at the time of embedding the conductive ceramic member 17E, the Mo mesh 18 with the same diameter as that of the conductive ceramic member 17E is placed on the conductive ceramic member 17E, on which the metallic conductive member 21 as a bulk is placed. The raw aluminum nitride powder for the ceramic base 11 is then poured over the same, and uniaxial pressing is performed together to the stacked raw material. The embedded metallic conductive member 21 is preferably configured to have a diameter of not more than 3 mm and a height of not more than 2 mm so as not to prevent contraction of ceramic powder at sintering.

Only an amount of the raw ceramic powder for the ceramic base 11 necessary to provide a predetermined thickness is put oil the stacked materials and subjected to uniaxial pressing again. The resistance heating element 19 is then placed thereon. The resistance heating element 19 can be a metallic bulk body processed into a predetermined shape such as a coil or a spiral and made of high melting point metal such as Mo or W.

After the resistance heating element 19 is placed, only an amount of the raw ceramic powder for the ceramic base 11 necessary to provide a predetermined thickness is put thereon, and uniaxial pressing is then performed again to obtain a stacked compact.

The obtained compact, is heated and fired using hot pressing, pressureless sintering, or the like to produce a sintered body. When the sintered body is produced, hot pressing is advantageous because uniaxial pressing is performed at, the same time of firing to achieve better adherence between the electrode and aluminum nitride sintered body. The firing temperature, which depends on the amount of the sintering additive added, is preferably 1650 to 2200° C. The atmosphere of the firing is a vacuum, inert, or reduction atmosphere.

The surface (heating surface) of the obtained sintered body for the ceramic base 11 which is closer to the electrode is subjected to grinding to form a dielectric layer with a predetermined thickness. The terminal hole 11c is drilled into the sintered body from the opposite surface of the sintered body toward the heating surface. The terminal hole 11c is then screwed with the sleeve 14, and the stress relieving member 15 and terminal 13 are brazed in the inner space of the sleeve 14, thus obtaining the heating device. The heating device can be further mechanically processed into a predetermined shape, or the surface roughness of the heating surface can be adjusted.

EXAMPLES

Heating devices were manufactured according to the aforementioned manufacturing method.

Aluminum nitride powder containing 5 wt % $Y_2O_3$ was put into a mold with a diameter of 345 mm so as to have a thickness of 1.5 mm after sintering and subjected to uniaxial pressing into disks. Next, Mo meshes with diameters of 335 mm as the high frequency electrode was placed on the disks.

For the conductive ceramic members 17A to 17E, sintered bodies for the conductive ceramic members having various shapes were formed in advance of aluminum nitride containing 12 wt % carbon fibers and 5 wt % $Y_2O_3$. These cylindrical sintered bodies had volume resistivities of 0.05 Ω·cm, porosities of 0.2 to 6%, and thermal expansion coefficients of 5.6 ppm/K. The sintered bodies were placed on the above-described Mo meshes.

Next, 5 wt % $Y_2O_3$ contained aluminum nitride powder was put into a mold so as to have a thickness of 8.8 mm after sintering and then subjected to uniaxial pressing again. Resistance heating elements composed of Mo coils were set thereon, and 5 wt % $Y_2O_3$ contained aluminum nitride powder was put into a mold over the Mo coils, followed by uniaxial pressing, thus obtaining stacked compacts as heater plates.

The compacts were fired at 2100° C. in a nitrogen inert atmosphere in a hot pressing furnace.

In each of the fired heater plates, the conductive ceramic member was in contact with the high frequency electrode and tightly adhered to the ceramic base therearound without forming any micro-gap. The porosity thereof was 0.1% or less. The thermal expansion coefficients of the ceramic bases were 5.7 ppm/K, and the thicknesses of the obtained heater plates were 19 mm.

A terminal hole was bored in each sintered body so that both ends of the resistance heating element and the conductive ceramic member or metallic conductive member were exposed in the rear surface of the heater plate. Thereafter, a Ni terminal was joined to the terminal hole with the stress relieving member and gold solder interposed therebetween.

For each heating device thus obtained, the Ni terminal was pushed toward the heating surface, and push load when cracks began to occur in the heating surface was examined. The heater plate was placed in a tensile tester so that the load was applied to the Ni terminal in parallel to the central axis of the terminal, and tensile strength of the joint part of the terminal was examined. Examinations were made on frequencies of cracks during manufacture and frequencies of cracks after repeating a heat cycle test 300 times. The heat cycle test involved heating and cooling between the room temperature and 600° C.

Results thereof are shown in Table 1.

TABLE 1

| | Terminal Structure | Conductive Ceramic Member Diameter A (mm) | Conductive Ceramic Member Thickness B (mm) | Terminal Hole Bottom Surface Diameter C (mm) | Dielectric Layer Thickness D (mm) | Crack During Manufacture (%) | Average Compression Strength (N) | Average Tensile Strength (N) | Crack after 300 Heat Cycles |
|---|---|---|---|---|---|---|---|---|---|
| COMPARATIVE EXAMPLE 1 | FIG. 2 | 2.5 | 1.5 | 6 | 1 | 5 | 304 | 882 | 30% |
| EXAMPLE 1 | FIG. 2 | 2.5 | 1.5 | 6 | 1 | 0 | 1627 | 1421 | 0 |
| EXAMPLE 2 | FIG. 2 | 3 | 1.5 | 6 | 1 | 0 | 1666 | 1519 | 0 |
| EXAMPLE 3 | FIG. 2 | 4 | 1.5 | 6 | 1 | 0 | 1617 | 1548 | 0 |
| EXAMPLE 4 | FIG. 3 | 6 | 2.5 | 6 | 1 | 0 | 1950 | 1499 | 0 |
| EXAMPLE 5 | FIG. 3 | 6 | 3.0 | 6 | 1 | 0 | 1970 | 1460 | 0 |
| EXAMPLE 6 | FIG. 3 | 6 | 3.5 | 6 | 1 | 0 | 1960 | 1421 | 0 |
| EXAMPLE 7 | FIG. 4 | 8 | 5.0 | 6 | 1 | 0 | 2176 | 2205 | 0 |
| EXAMPLE 8 | FIG. 4 | 8 | 6.0 | 6 | 1 | 0 | 2244 | 2499 | 0 |
| EXAMPLE 9 | FIG. 4 | 8 | 7.0 | 6 | 1 | 0 | 2225 | 2254 | 0 |

As shown in Table 1, Examples 1 to 3 have the structure shown in FIGS. 1 and 2. In Examples 1 to 3, the crack frequencies during manufacture and crack frequencies after 300 heat cycles were less than those of the conventional heating device, and the average compression strengths and tensile strengths were larger than those of the conventional heating devices.

Examples 4 to 6 have the structure shown in FIG. 3, in each of which the diameter A of the conductive ceramic member was larger than the diameter C of the terminal hole and the conductive ceramic member had low current density and low resistance The thickness B of the ceramic member can be made thick, and temperature of the conductive ceramic member can be prevented from increasing, thus Example 4 to 6 can increase the compression strength more preferably.

Examples 7 to 9 have the structure shown in FIG. 4, in each of which the conductive ceramic member were cylindrical with larger diameter A and was joined to the Ni sleeve by the threaded side surface In these Examples, the wall thickness of the joined part of the sleeve was desirably not more than 0.3 mm so as to absorb the difference in thermal expansion between the ceramic base and the Ni sleeve. In Examples 7 to 9, by joining the conductive ceramic members to the side surfaces of the terminal holes, increasing the joint areas effectively increased the tensile strength. Moreover, the results revealed that the thickness of the conductive ceramic member could be thick substantially up to the difference between the thickness of the heater plate and the thickness D of the dielectric layer. In the environment where the conductive ceramic member is not oxidized, for example, such as a nitrogen atmosphere, the brazing material to prevent oxidation of the conductive ceramic member is unnecessary, and the conductive ceramic member and sleeve can be connected by screwing. The brazing step can be therefore eliminated.

Next, heating devices shown in FIGS. 5 and 6 and FIG. 7 were produced. These heating devices were manufactured in the same way as those of the foregoing examples, and the compositions of the raw materials, thicknesses of the heater plates, and the like were the same as those of the foregoing examples.

Each of the obtained heating devices was examined in terms of the push load and crack frequencies similar to the aforementioned examples and also examined in terms of thermal uniformity in the heating surface and a change in resistance by soaking. The thermal uniformity was examined in the cases where power was not supplied to the high frequency electrode and where power was supplied to the high frequency electrode. Herein, the thermal uniformity is indicated by a difference between a temperature at the center of the terminal in the heating surface and an average of temperatures at four points on a circle 30 mm in diameter around the terminal. As for the change in resistance by soaking, a difference between resistance after brazing and resistance after soaking at 500° C. was measured by boring a hole on the high frequency electrode side of the heater plate and making an electrical circuit between the terminal and the high frequency electrode exposed to the terminal hole.

Results of these examinations are shown in Table 2-1 and Table 2-2.

| | Terminal Structure | Distance between Heating Surface and Terminal Joint Surface E (mm) | Bottom Surface Diameter of AlN Conductive Protruding Member A (mm) | Disk Height of AlN Conductive Protruding Member F1 (mm) | Height of AlN Conductive protruding Member F2 (mm) | Diameter of Part of AlN Conductive Protruding Member Exposed in Terminal G (mm) | Diameter of Terminal Hole Bottom Surface C (mm) |
|---|---|---|---|---|---|---|---|
| COMPARATIVE EXAMPLE 1 | FIG. 8 | 2.5 | None | None | Made of Mo 1.5 *1 | Mo 3 *3 | 6 |
| EXAMPLE 11 | FIG. 5 | 4 | 30 | 2 | 1 | 3 | 6 |
| EXAMPLE 12 | FIG. 5 | 5 | 30 | 3 | 1 | 3 | 6 |
| EXAMPLE 13 | FIG. 5 | 6 | 30 | 3 | 2 | 3 | 6 |
| EXAMPLE 14 | FIG. 5 | 6 | 30 | 4 | 1 | 3 | 6 |
| EXAMPLE 15 | FIG. 5 | 5 | 10 | 3 | 1 | 3 | 6 |

-continued

|  | Terminal Structure | Distance between Heating Surface and Terminal Joint Surface E (mm) | Bottom Surface Diameter of AlN Conductive Protruding Member A (mm) | Disk Height of AlN Conductive Protruding Member (mm) | Height of AlN Conductive protruding Member F1 (mm) | Diameter of Part of AlN Conductive Protruding Member Exposed in Terminal G (mm) | Diameter of Terminal Hole Bottom Surface C (mm) |
|---|---|---|---|---|---|---|---|
| EXAMPLE 16 | FIG. 5 | 5 | 30 | 3 | 1 | 4 | 6 |
| EXAMPLE 17 | FIG. 5 | 5 | 30 | 3 | 1 | 5 | 6 |
| EXAMPLE 18 | FIG. 5 | 5 | 50 | 3 | 1 | 3 | 6 |
| EXAMPLE 19 | FIG. 7 | 5.5 | 30 | 3 | Made of Mo 1.5 *1 | Mo 3 *3 | 6 |
| EXAMPLE 20 | FIG. 7 | 5.5 | 30 Including Mo mesh *2 | 3 | Made of Mo 1.5 *1 | Mo 3 *3 | 6 |

*1: A molybdenum bulk body having a height of 1.5 mm was used instead of AlN conductive protruding member.
*2: A molybdenum mesh was placed between an AlN conductive member and a molybdenum bulk body.
*3: A molybdenum bulk body was exposed instead of an AlN conductive protruding member.

TABLE 2-2

|  | Crack during Manufacture frequency | Average Compression Strength (N) | Thermal Uniformity ΔT without RF (° C.) | Thermal Uniformity ΔT with RF (° C.) | Crack after 300 Heat Cycles frequency | Change in Resistance after Soaking at 500° C. in Air for 500 hr |
|---|---|---|---|---|---|---|
| COMPARATIVE EXAMPLE 1 | 5% | 304 | −1.6 | +1.8 | 30% | 30% |
| EXAMPLE 11 | 0% | 764 | −0.4 | +0.6 | 0% | <5% |
| EXAMPLE 12 | 0% | 902 | 0 | +0.2 | 0% | <5% |
| EXAMPLE 13 | 0% | 980 | −0.2 | +0.3 | 0% | <5% |
| EXAMPLE 14 | 0% | 1078 | 0 | +0.2 | 0% | <5% |
| EXAMPLE 15 | 0% | 911 | −0.2 | +0.7 | 0% | <5% |
| EXAMPLE 16 | 0% | 862 | 0 | +0.1 | 0% | <5% |
| EXAMPLE 17 | 0% | 902 | −0.2 | +0.1 | 0% | 15% |
| EXAMPLE 18 | 0% | 892 | −0.1 | +0.2 | 0% | <5% |
| EXAMPLE 19 | 0% | 882 | −0.1 | +0.3 | 0% | <5% |
| EXAMPLE 20 | 0% | 152 | −0.1 | +0.3 | 0% | <5% |

Examples 11 to 18 of Table 2-1 and Table 2-2 were the heating device shown in FIGS. 5 and 6, and Examples 19 and 20 were the heating device shown in FIG. 7. As apparent from these examples shown in Table 2-1 and Table 2, 2, the heating devices according to the present invention had no cracks occurring during manufacture and had high strength to compression at the terminal. In the heating devices of the present invention, local decreases in temperature was small while power was not supplied to the high frequency electrodes, and local increases in temperature were also small while power was supplied to the high frequency electrodes. Moreover, cracks were not, caused by repeated heating. Furthermore, the changes in electrical resistance were reduced. This is because the diameters of the top parts of the protruding portions of the conductive ceramic members exposed in the bottom surfaces were smaller than the diameters of the bottom surfaces of the terminal holes by 2 mm or more and therefore oxidation of carbon fibers (carbon nanotubes) contained in the conductive ceramic member was prevented.

Hereinabove, the heating device of the present invention is described using the examples and drawings. However, the heating device is not limited by these examples and drawings and can be variously changed without departing from the spirit of the present invention. The terminal structure of the present invention is not limited to an application to the heating device and can be applied to a device which includes an electrode embedded in a base made of ceramic and a terminal connected to the terminal, such as an electrostatic chuck.

What is claimed is:
1. A heating device comprising:
a plate-shaped base mainly composed of an insulating ceramic;
a planar electrode embedded near a first surface of the base;
a terminal hole drilled in an opposed second surface of the base toward the electrode and having a terminus end spaced a distance from the electrode;
an electrical terminal inserted in the terminal hole; and
an electrically conductive ceramic member, having a thermal expansion coefficient equal to that of the insulating ceramic of the base, embedded in the base and located between, and in direct electrical contact with, the terminus end of the terminal hole and the electrode, and connected to the electrode in the base, whereby the electrode and the electrical terminal are electrically connected at least through the conductive ceramic member.
2. The heating device according to claim 1, wherein the conductive ceramic member has a plate-shape, wherein a part of a main surface of the conductive ceramic member defines at least a portion of the terminus end of the terminal hole, and wherein the main surface of the conductive ceramic member is larger than the terminus end of the terminal hole.

3. The heating device according to claim 1, wherein the conductive ceramic member has a recess defining the terminus end of the terminal hole, and also defining portions of threaded side surfaces of the terminal hole.

4. The heating device according to claim 1, wherein the conductive ceramic member has a protruding shape whose surface is exposed to define a portion of the terminus end of the terminal hole, wherein the surface of the protruding shape is smaller than the terminus end of the terminal hole.

5. The heating device according to claim 1, further comprising a metallic electrode material interposed between the conductive ceramic member and the terminus end of the terminal, wherein a planar part of the metallic electrode material exposed at the terminus end of the terminal hole is smaller than the terminus end of the terminal hole.

6. The heating device according to claim 1, wherein a volume resistivity of the conductive ceramic member is not more than 10 Ω·cm.

7. The heating device according to claim 6, wherein the base and the conductive ceramic member are mainly made of aluminum nitride ceramic, and the conductive ceramic member is made of aluminum nitride containing carbon fibers.

* * * * *